United States Patent
Xu

(10) Patent No.: US 12,364,071 B2
(45) Date of Patent: *Jul. 15, 2025

(54) LIGHT EMITTING DEVICE INCLUDING MULTIPLE PHOTOLUMINESCENCE MATERIALS

(71) Applicant: Bridgelux, Inc., Fremont, CA (US)

(72) Inventor: Tao Xu, Fremont, CA (US)

(73) Assignee: Bridgelux, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/435,530

(22) Filed: Feb. 7, 2024

(65) Prior Publication Data

US 2024/0243236 A1 Jul. 18, 2024

Related U.S. Application Data

(60) Continuation of application No. 17/222,077, filed on Apr. 5, 2021, now Pat. No. 11,923,484, which is a division of application No. 16/429,303, filed on Jun. 3, 2019, now Pat. No. 10,971,659.

(51) Int. Cl.
*H10H 20/851* (2025.01)
*H01L 25/075* (2006.01)
*H10H 20/01* (2025.01)
*H10H 20/857* (2025.01)

(52) U.S. Cl.
CPC ..... *H10H 20/8513* (2025.01); *H01L 25/0753* (2013.01); *H10H 20/0361* (2025.01); *H10H 20/857* (2025.01)

(58) Field of Classification Search
CPC ............... H01L 33/504; H01L 25/0753; H01L 2933/0041
See application file for complete search history.

(56) References Cited

U.S. PATENT DOCUMENTS

| | | | |
|---|---|---|---|
| 10,371,325 B1 * | 8/2019 | Yuan | H10H 20/8513 |
| 10,468,564 B1 | 11/2019 | Zhao et al. | |
| 11,923,484 B2 * | 3/2024 | Xu | H01L 25/0753 |
| 2013/0063020 A1 | 3/2013 | Daicho | |
| 2015/0002023 A1 * | 1/2015 | Imangholi | H01L 33/32 |
| | | | 315/129 |
| 2019/0234581 A1 * | 8/2019 | Iwakura | B60Q 1/34 |
| 2019/0319016 A1 * | 10/2019 | Zhang | H01L 33/505 |
| 2020/0321497 A1 * | 10/2020 | Kadan | H01L 27/156 |

* cited by examiner

*Primary Examiner* — Wasiul Haider
(74) *Attorney, Agent, or Firm* — Shirley A. Recipon

(57) ABSTRACT

An exemplary white light emitting device may include first and second LEDs operable to generate excitation light having a dominant wavelength in a range from 440 nm to 480 nm, where the first LEDs and second LEDs are mounted on a substrate; a first photoluminescence material which emits light having a peak emission wavelength in a range from 500 nm to 590 nm in response to the excitation light; and a second photoluminescence material which emits light having a peak emission wavelength in a range from 600 nm to 650 nm in response to the excitation light; wherein the first LEDs are covered by the first photoluminescence material, and the second LEDs are covered by the first and second photoluminescence materials.

14 Claims, 5 Drawing Sheets

SECTION A-A

LIGHT EMITTING DEVICE INCLUDING MULTIPLE PHOTOLUMINESCENCE MATERIALS

CROSS-REFERENCE TO RELATED APPLICATIONS

This application is a continuation of U.S. patent application Ser. No. 17/222,077, filed Apr. 5, 2021; which in turn is a divisional of U.S. patent application Ser. No. 16/429,303, filed on Jun. 3, 2019, now U.S. Pat. No. 10,971,659; each of which is incorporated by reference herein in its entirety.

FIELD OF THE INVENTION

Embodiments of the present invention are directed to white light emitting devices; in particular, although not exclusively, to white light emitting devices including multiple photoluminescence materials. More particularly, exemplary white light emitting devices include first LEDs and second LEDs, covered by first and second photoluminescence materials.

BACKGROUND OF THE INVENTION

White light emitting LEDs ("white LEDs") include one or more photoluminescence materials (typically inorganic phosphor materials), which absorb a portion of the excitation light (typically blue or red) emitted by the LED and re-emit light of a different color (wavelength). The portion of the excitation light generated by the LED that is not absorbed by the photoluminescence material combined with the light emitted by the photoluminescence material provides light which appears to the eye as being white in color. Due to their long operating life expectancy (>50,000 hours) and high luminous efficacy (100 lumens per watt and higher), white LEDs are rapidly replacing conventional fluorescent, compact fluorescent and incandescent lamps.

One form of a white light emitting device is Chip-on-Board (COB), in which multiple LED chips (dies) are located on a substrate before one or more photoluminescence materials is disposed thereon. Typically, a COB white LED includes blue LED chips which are covered by a mixture of red and green/yellow photoluminescence materials. However, COB white LEDs can suffer from low luminous efficacy.

Some white light emitting LEDs include red LED chips that do not include phosphor/photoluminescence materials. More particularly, the red LED chips do not involve wavelength conversion to generate red light. While white light emitting LEDs including red LED chips are considered to be relatively efficient compared with other forms, they can suffer from poor thermal stability; that is, they can exhibit poor color stability with changes in temperature; due to blue and red LED chips having different thermal characteristics.

Thus, there is a need for a white light emitting device that exhibits improved luminous efficacy and thermal stability, and the present invention addresses and/or overcomes the limitations discussed above by presenting new designs and methods not hitherto contemplated nor possible by known constructions.

SUMMARY OF THE INVENTION

In an aspect of the invention, there is provided a white light emitting device that includes first LEDs and second LEDs operable to generate excitation light having a dominant wavelength in a range from 440 nm to 480 nm and mounted on a substrate; a first photoluminescence material which generates light having a peak emission wavelength in a range from 500 nm to 590 nm; and a second photoluminescence material which generates light having a peak emission wavelength in a range from 600 nm to 650 nm, wherein the first LEDs are covered by the first photoluminescence material, and the second LEDs are covered by the first and second photoluminescence materials. It may be that the first LEDs are covered by the first photoluminescence material only, and the second LEDs are covered by both the first and second photoluminescence materials.

In an aspect of the invention, a white light emitting device that includes a combination of a first and second photoluminescence material exhibits improved luminous efficacy and thermal stability compared with known constructions. More particularly, the arrangement in which a first LED is covered by the first photoluminescence material, and a second LED is covered by the first and second photoluminescence materials, converts the blue light into red light more effectively. That is, the majority of the blue excitation light from the second LED is converted by the second photoluminescence material to light having a peak emission wavelength in a range from 600 nm to 650 nm, that is red light. White light is thus generated from the combination of the unconverted blue excitation light from the first and second LED, the light having a peak emission wavelength in a range from 500 nm to 590 nm generated by the first photoluminescence material, and the light having a peak emission wavelength in a range from 600 nm to 650 nm generated by the second photoluminescence material.

It may be that the first photoluminescence material covers the light emitting faces of the first LED. More particularly, the first photoluminescence material may cover the faces opposite and adjacent the substrate on which the first LED is mounted. This may improve the uniformity of light emission from the first LED, for example.

The first and second photoluminescence materials may cover the light emitting faces of the second LED. More particularly, the first and second photoluminescence materials may cover the faces opposite and adjacent the substrate on which the second LED is mounted. This may improve the uniformity of light emission from the second LED, for example. This may also improve luminous efficacy since more of the blue excitation light will be exposed to the first and second photoluminescence materials leading to improved levels of converted light having a peak emission wavelength ranging from 500 nm to 590 nm and from 600 nm to 650 nm.

The first photoluminescence material may be directly in contact with the first LED. This may improve luminous efficacy, since more of the blue excitation light will be exposed to the first photoluminescence material leading to improved levels of converted light having a peak emission wavelength ranging from 500 nm to 590 nm.

In some embodiments, the first photoluminescence material may be located remotely to the first LEDs and second LEDs. It may be that another material is located between the first photoluminescence material and the first LEDs and second LEDs, for instance. This enables the white light emitting device of the present invention to be more versatile with regard to the different types of photoluminescence materials or other materials that it includes.

The first photoluminescence material may be in the form of a component. This may allow retro-fitting of such a component so that the white light emitting device can be assembled and disassembled more easily. It may also allow simple replacement of the component having the first photoluminescence material with a different first photoluminescence material to achieve a desired color temperature or luminous efficacy for instance.

The second photoluminescence material may be directly in contact with the second LED. This may improve luminous efficacy, since the second photoluminescence material will be exposed to more of the blue excitation light leading to improved levels of converted light having a peak emission wavelength ranging from 600 nm to 650 nm.

The first photoluminescence material may generate light having a peak emission wavelength in a range from 520 nm to 530 nm.

The second photoluminescence material may generate light having a peak emission wavelength in a range from 620 nm to 635 nm.

It may be that the first photoluminescence material includes a first phosphor material and/or the second photoluminescence material includes a second phosphor material.

The first photoluminescence material may be excitable to generate white light having a correlated color temperature of 5000K to 6500K. Similarly, the second photoluminescence material may be excitable to, in combination with the first photoluminescence material, generate white light having a correlated color temperature of 2700K to 3500K. In this way, the white light emitting device may be color tunable.

The first phosphor material may include at least one phosphor material selected from the group of: a garnet (YAG) phosphor of general composition $Y_{3-x}(Al_{1-y}Ga_y)_5O_{12}:Ce_x$; $(Y,Ba)_{3-x}(Al_{1-y}Ga_y)_5O_{12}:Ce_x$; a LuAG phosphor of general composition $Lu_{3-x}(Al_{1-y}M_y)_5O_{12}:Ce_x$ where M=Mg, Ca, Sr, Ba, Ga; an orthosilicate phosphor of general composition $A_2SiO_4:Eu$ where A=Mg, Ca, Sr, Ba, $(Sr_{1-x}Ba_x)_2SiO_4:Eu$; and/or an oxynitride phosphor of general composition $M_xSi_{12-(m+n)}Al_{m+n}O_nN_{16-n}:Eu$ where M=Mg, Ca and/or Sr.

The second phosphor material may include at least one phosphor material selected from the group of: a nitride (CASN) phosphor of general composition $(Ca_{1-x}Sr_x)AlSiN_3:Eu$; a nitride (2:5:8) phosphor of general composition $Ba_{2-x}Sr_xSi_5N_8:Eu$; $MSe_{1-x}S_x:Eu$ where M=Mg, Ca, Sr, Ba, Zn; $CaSc_{1-x}S_x:Eu$, $(Sr_{1-x}M_x)_yEu_zSiO_5$ where M=Ba, Mg, Ca, Zn; and/or a complex fluoride phosphor of general composition $K_2SiF_6:Mn^{4+}$; and $K_2TiF_6:Mn^{4+}$.

It may be that the first photoluminescence material includes a first quantum dot material and/or the second photoluminescence material includes a second quantum dot material. A quantum dot (QD) is a portion of matter (e.g., a semiconductor) whose excitons are confined in all three spatial dimensions that may be excited by radiation energy to emit light of a particular wavelength or range of wavelengths. QDs can include different materials, for example cadmium selenide (CdSe). The color of light generated by a QD is enabled by the quantum confinement effect associated with the nano-crystal structure of the QD. The energy level of each QD relates directly to the physical size of the QD. For example, the larger QDs, such as red QDs, can absorb and emit photons having a relatively lower energy (i.e., a relatively longer wavelength). On the other hand, green QDs, which are smaller in size can absorb and emit photons of a relatively higher energy (shorter wavelength). Examples of suitable QDs include: CdZnSeS (cadmium zinc selenium sulfide), $CdxZn_{1-x}Se$ (cadmium zinc selenide), $CdSexS_{1-x}$ (cadmium selenium sulfide), CdTe (cadmium telluride), $CdTexS_{1-x}$ (cadmium tellurium sulfide), InP (indium phosphide), $InxGa_{1-x}P$ (indium gallium phosphide), InAs (indium arsenide), $CuInS_2$ (copper indium sulfide), $CuInSe_2$ (copper indium selenide), $CuInS_xSe_{2-x}$ (copper indium sulfur selenide), $Cu In_xGa_{1-x}S_2$ (copper indium gallium sulfide). $CuIn_xGa_{1-x}Se_2$ (copper indium gallium selenide), $CuIn_xAl_{1-x}Se_2$ (copper indium aluminum selenide), $CuGaS_2$ (copper gallium sulfide) and $CuInS_{2x}ZnS_{1-x}$ (copper indium selenium zinc selenide). The optical properties of the core nano-crystals in one material can be altered by growing an epitaxial-type shell of another material. Depending on the requirements, the core/shell nano-crystals can have a single shell or multiple shells. The shell materials can be chosen based on the band gap engineering. For example, the shell materials can have a band gap larger than the core materials so that the shell of the nano-crystals can separate the surface of the optically active core from its surrounding medium. In the case of the cadmium-based QDs, e.g. CdSe QDs, the core/shell quantum dots can be synthesized using the formula of CdSe/ZnS, CdSe/CdS, CdSe/ZnSe, CdSe/CdS/ZnS, or CdSe/ZnSe/ZnS. Similarly, for $CuInS_2$ quantum dots, the core/shell nanocrystals can be synthesized using the formula of $CuInS_2/ZnS$, $CuInS_2/CdS$, $CuInS_2/CuGaS_2$, $CuInS_2/CuGaS_2/ZnS$ and so on.

The white light emitting device may include a plurality of first LEDs and second LEDs. For instance, the plurality of first and second LEDs may be in the form of symmetrical arrays. Symmetrical arrays may improve the uniformity of light emission by the white light emitting device. More particularly, the plurality of first and second LEDs may be configured such that their arrays are symmetrically/evenly distributed.

The plurality of first and second LEDs may be in the form of asymmetrical arrays. Despite this, the white light emitting device exhibits improved luminous efficacy and does not suffer from reduced uniformity by way of the configuration of the first LED being covered by the first photoluminescence material, and the second LED being covered by the first and second photoluminescence materials.

Since the first LEDs and second LEDs each include blue LEDs, the first LEDs and second LEDs may be driven by the same drive current, which provides a simplified and robust system leading to improved efficacy.

The white light emitting device may include a first string having first LEDs and second LEDs in a ratio of 0:1 to 1:0, and a second string having first LEDs and second LEDs in a ratio of 0:1 to 1:0. and wherein the same voltage is applied to the first and second strings; in contrast to red LEDs, which have different drive characteristics.

Advantageously, in an aspect of the invention, the same power may be applied to the first and second strings, thereby providing a simplified and robust system. This is because the present invention may utilize all blue LEDs (including phosphor coated red, for instance). For example, with a known device including traditional blue and red LEDs, it is necessary to provide power with different characteristics to different strings, based on the different drive characteristics of blue and red LEDs. Since all the LEDs in the first and second strings of the present invention have the same thermal characteristics, the system produces a more stable color output with changes in temperature compared with known constructions.

The power applied to the first and second strings may be independently controllable. The white light emitting device may thus be color tunable.

The first LEDs and/or second LEDs may be in the form of a flip chip, vertical chip or lateral chip.

In an aspect of the invention, the white light emitting device may include a diffusing layer. The diffusing layer may improve the color uniformity, particularly color over angle, of light emission by the white light emitting device.

The diffusing layer may be in direct contact with the first photoluminescence material. It may be that the diffusing layer includes a light transmissive material and light scattering particles. Enhanced color uniformity is particularly advantageous when the device is used in large beam optics. Moreover, the amount of photoluminescence material used may also be reduced thereby providing a more cost-effective manner of manufacturing the white light emitting device. This is because the diffusing layer including light scattering particles increases the probability that a photon will result in the generation of photoluminescence light by directing light back into the first or second photoluminescence materials. Thus, the amount of photoluminescence material required to generate a given color temperature of light can be reduced since more of the blue excitation light is converted to photoluminescence light owing to the diffusing layer.

In some embodiments, the substrate includes a circuit board. For example, the substrate may include a ceramic substrate or metal core printed circuit board.

In some embodiments, the white light emitting device described herein may be a tunable white light emitting device.

According to an aspect of the present invention, a method of manufacturing a white light emitting device may include the steps of providing at least one first LED and second LED operable to generate excitation light having a dominant wavelength in a range from 440 nm to 480 nm; providing a first photoluminescence material which generates light having a peak emission wavelength in a range from 500 nm to 590 nm; providing a second photoluminescence material which generates light having a peak emission wavelength in a range from 600 nm to 650 nm; disposing the second photoluminescence material over the at least one second LED; and disposing the first photoluminescence material over the at least one first LED and second LED.

The method of manufacturing may include providing a plurality of first LEDs and second LEDs.

The method of manufacturing may include disposing a diffusing layer over the first photoluminescence material.

In an aspect of the invention, the present invention envisages a white light emitting device including at least one first LED operable to generate excitation light having a dominant wavelength in a range from 440 nm to 480 nm; a first photoluminescence material which generates light having a peak emission wavelength in a range from 500 nm to 590 nm; and a photoluminescence converted LED operable to generate light having a peak emission wavelength in a range from 600 nm to 650 nm, the photoluminescence converted LED including a second LED operable to generate excitation light and a second photoluminescence material that covers the light emitting faces of the second LED; and wherein the first photoluminescence material covers the first LED and the photoluminescence converted LED.

In an aspect of the invention, a white light emitting device includes a first LED operable to generate excitation light having a dominant wavelength in a range from 440 nm to 480 nm; a first photoluminescence material which generates light having a peak emission wavelength in a range from 500 nm to 590 nm; and a photoluminescence converted LED operable to generate light having a peak emission wavelength in a range from 600 nm to 650 nm, where the photoluminescence converted LED includes a second LED operable to generate excitation light having a dominant wavelength in a range from 440 nm to 480 nm and a second photoluminescence material which generates light having a peak emission wavelength in a range from 600 nm to 650 nm and covers the light emitting faces of the LED; and where the first photoluminescence material covers the first LED and the photoluminescence converted LED.

The photoluminescence converted LED may generate light with a peak emission wavelength in a range from 600 nm to 650 nm.

BRIEF DESCRIPTION OF THE DRAWINGS

These and other aspects and features of the present invention will become apparent to those ordinarily skilled in the art upon review of the following figures and description of specific embodiments of the invention.

DETAILED DESCRIPTION OF THE INVENTION

Figure 1A:
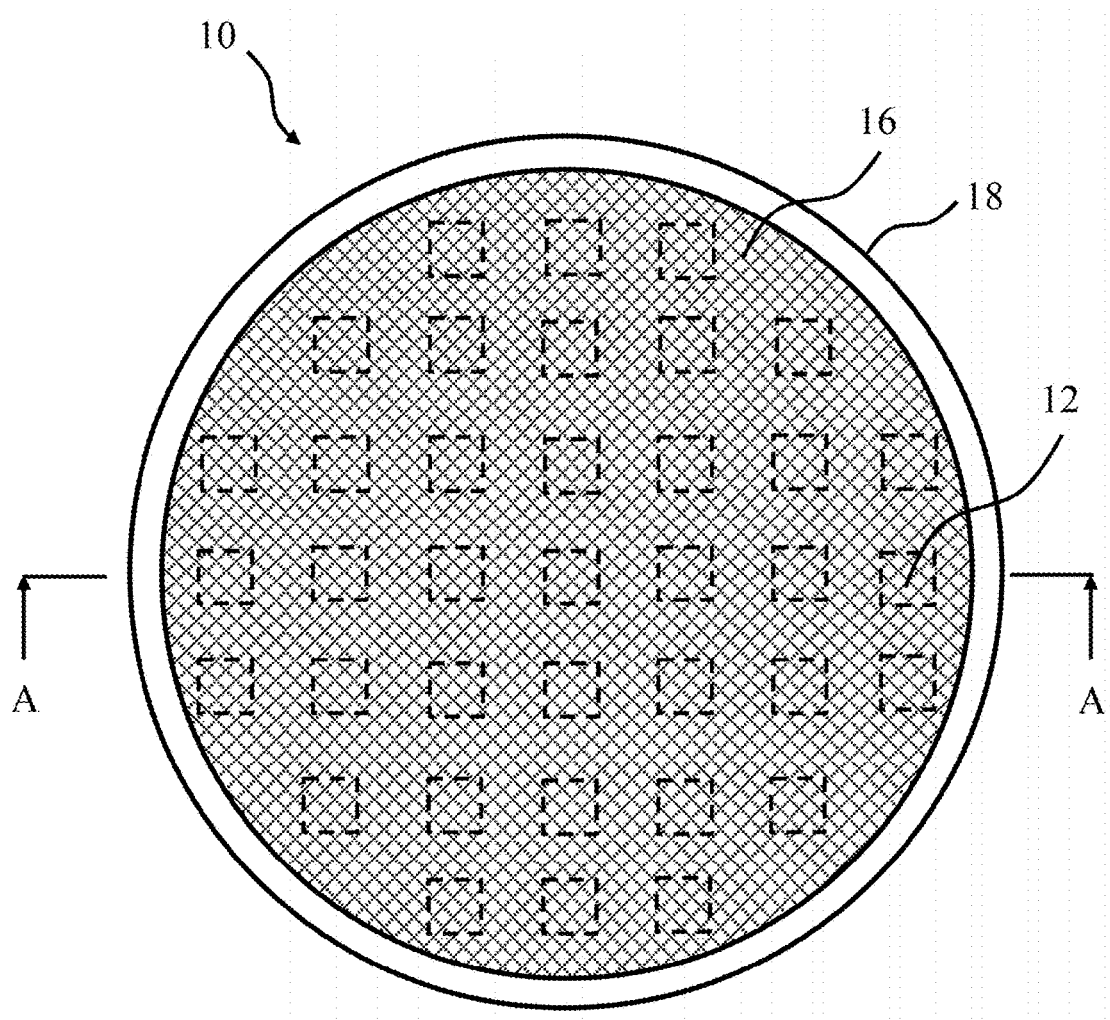
FIG. 1A is a plan view of a known white light emitting device.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein. Throughout this specification, like reference numerals are used to denote like parts.

A known white light emitting device 10 will now be described with reference to FIGS. 1A and 1B.

The known white light emitting device 10 includes LED dies 12 disposed on a substrate 14, and a photoluminescence material mixture 16 disposed over LED dies 12.

Figure 1B:
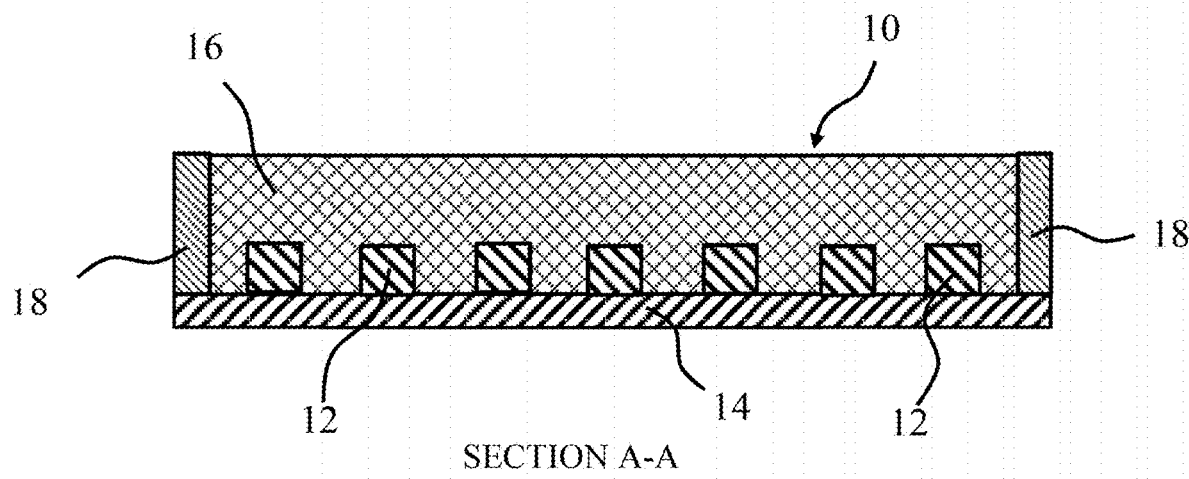
FIG. 1B is a cross sectional side view through A-A.

More particularly, FIG. 1A shows a plan view of a known COB light emitting device 10, and FIG. 1B, shows a cross section side view through A-A (of FIG. 1A). The known light emitting device 10 has a circular shape. Thus, the circular substrate 14 is planar and disk shaped. The circular substrate 14 is a metal core printed circuit board (MCPCB). Forming a COB arrangement, seven arrays (rows) of blue LED dies 12 are evenly distributed on the circular substrate 14 in the form of a square array. The circular substrate 14 also includes about its entire perimeter a wall 18 which encloses all the arrays of blue LED dies 12.

Typically, the photoluminescence material mixture 16 includes a homogenous mixture of cerium-activated yellow garnet (YAG) phosphor having a general composition $Y_3(Al,Ga)_5O_{12}$:Ce and a europium-activated red-emitting nitride (CASN) phosphor having a general composition $CaAlSiN_3$:$Eu^{2+}$. Blue excitation light from the blue LED dies 12 is converted to yellow and red light by the $Y_3(Al,Ga)_5O_{12}$:Ce and $CaAlSiN_3$:$Eu^{2+}$ phosphors respectively. The combination of the yellow, red and unconverted blue light generates white light.

The photoluminescence material mixture 16 is deposited onto the circular substrate 14 inside the wall 18 and completely covers the blue LED dies 12. The known light emitting device 10 can suffer from low luminous efficacy.

Some white light emitting LEDs include red LED dies that do not include phosphor/photoluminescence materials. More particularly, those red LED dies do not involve wavelength conversion to generate red light. While white light emitting LEDs including red LED dies are considered to be relatively efficient compared with other forms, they suffer from poor thermal stability; that is, they can exhibit poor color stability with changes in temperature.

Figure 2A:
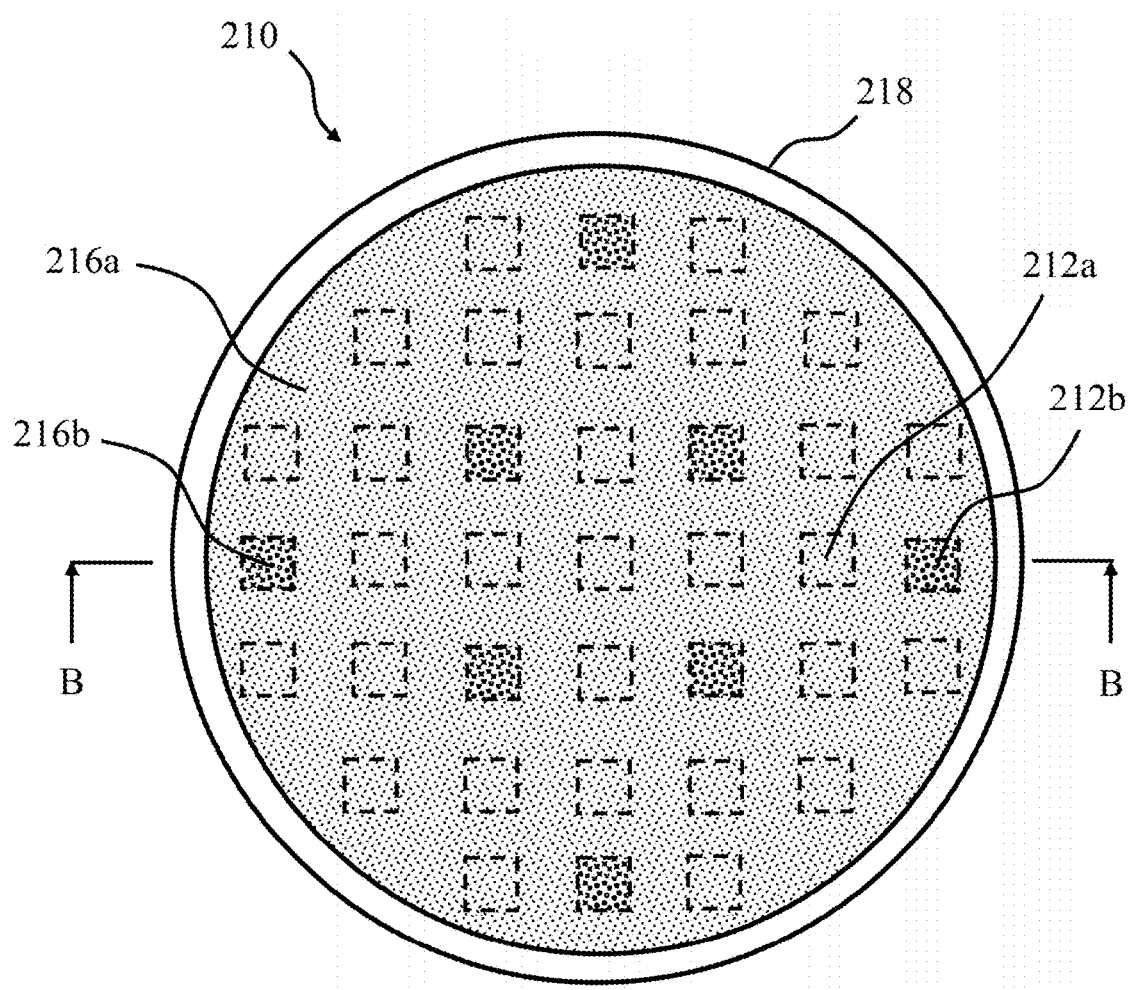
FIG. 2A is a plan view of a white light emitting device in accordance with an embodiment of the invention.
Figure 2B:
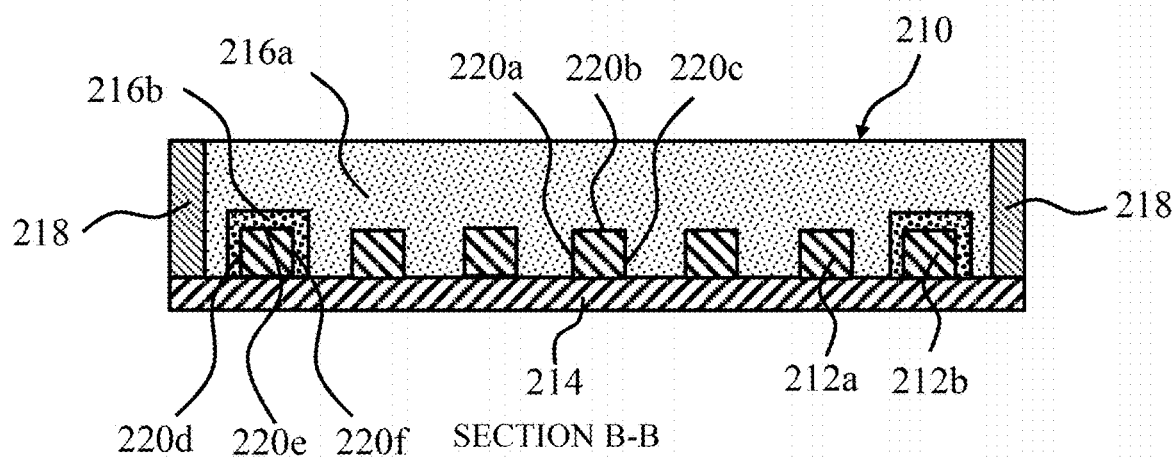
FIG. 2B is a cross sectional side view through B-B.

Referring now to FIGS. 2A and 2B, there is described a white light emitting device 210 formed in accordance with the present invention. One of the main differences between the white light emitting device 210 and the known white light emitting device 10 of FIG. 1 is that the white light emitting device 210 does not include a photoluminescence material mixture 16 in the same way as the known white light emitting device 10 of FIG. 1. Rather, in the white light emitting device 210 the yellow and red phosphors are provided in respective separate layers, instead of a mixture as shown in FIG. 1.

The white light emitting device 210 includes first LED dies (InGaN—indium gallium nitride dies) 212a and second LED dies (InGaN—indium gallium nitride dies) 212b disposed on a substrate 214, and a first photoluminescence material 216a and a second photoluminescence material 216b.

More particularly, FIG. 2A shows a plan view of a COB light emitting device 210, and FIG. 2B shows a cross section side view through B-B of FIG. 2A. The white light emitting device 210 has a circular shape. Thus, the circular substrate 214 is planar and disk shaped. The circular substrate 214 is a metal core printed circuit board (MCPCB). Forming a COB arrangement, seven arrays (rows) of blue first LEDs 212a and second LEDs 212b are distributed on the circular substrate 214. The first LEDs 212a and second LEDs 212b are operable to generate excitation light having a dominant wavelength in a range from 440 nm to 480 nm. In the embodiment illustrated, there are twenty-nine first LEDs 212a and eight second LEDs 212b that are evenly distributed on the circular substrate 214 in the form of a square array (symmetrical array). The second LEDs 212b are evenly distributed among the first LEDs 212a. The circular substrate 214 also includes about its entire perimeter a wall 218 which surrounds all the arrays of first LEDs 212a and second LEDs 212b.

The first photoluminescence material 216a includes a cerium-activated yellow garnet (YAG) phosphor having a general composition $Y_3(Al,Ga)_5O_{12}$:Ce dispersed in silicone. The first photoluminescence material 216a generates light having a peak emission wavelength in a range from 500 nm to 590 nm. The first photoluminescence material 216a is excitable to generate, in combination with unconverted blue excitation light, white light having a correlated color temperature of 5000K to 6500K ("cool white").

The second photoluminescence material 216b may include a europium-activated red-emitting nitride (CASN) phosphor having a general composition $CaAlSiN_3$:$Eu^{2+}$ dispersed in silicone. The second photoluminescence material 216b generates light having a peak emission wavelength in a range from 600 nm to 650 nm. The second photoluminescence material 216b is excitable to generate, in combination with unconverted blue excitation light and photoluminescence generated light by the first photoluminescence material, white light having a correlated color temperature of 2700K to 3500K ("warm white").

In this embodiment, the second LEDs 212b are coated with the second photoluminescence material 216b. The second LEDs are individually coated. The coating may be in the form of chip scale packaging (CSP), or each individual second LED 212b may be coated by another suitable method involving depositing the second photoluminescence material 216b thereon.

Following the positioning of the first LEDs 212a, which are uncoated, and second LEDs 212b, which are coated with the second photoluminescence material 216b, on the circular substrate 214, the first photoluminescence material 216a is deposited on the first LEDs 212a and second LEDs 212b inside the wall 218. As best seen in FIG. 2B, this results in the first LEDs 212a being covered by only the first photoluminescence material 216a, and the second LEDs 212b being covered by both the first photoluminescence material 216a and second photoluminescence material 216b. In other embodiments, the first LEDs 212a may be covered by the first photoluminescence material, and the second LEDs 212b may be covered by the first photoluminescence material and second photoluminescence material.

Blue excitation light from the first LEDs 212a is converted to yellow light by the $Y_3(Al,Ga)_5O_{12}$:Ce phosphor in the first photoluminescence material 216a. The majority, if not all, of the blue excitation light from the second LEDs 212b is converted to red light by the $CaAlSiN_3$:$Eu^{2+}$ phosphor in the second photoluminescence material 216b. Any unconverted blue excitation light from the second LEDs 212b is converted to yellow light by the $Y_3(Al, Ga)_5O_{12}$:Ce phosphor in the first photoluminescence material 216a. The combination of the yellow, red and unconverted blue light generates white light.

As seen in FIG. 2B, each of the first LEDs 212a have light emitting faces 220a, 220b, 220c. It will be appreciated that each of the first LEDs 212a also have two additional light emitting faces (not numbered) orthogonal to the light emitting faces 220a and 220c whose emissions are in a direction into and out of the plane of the page as illustrated in FIG. 2B. The same is true for each of the second LEDs 212b. Similarly, each of the second LEDs 212b have light emitting faces 220d, 220c, 220f. The respective light emitting faces 220a, 220c, 220d, 220f are sidewardly facing—that is, towards the wall 218. The respective light emitting faces 220b, 220e are upwardly facing—that is, along the vertical axes of the respective first and second LEDs 212a, 212b and orthogonal to the wall 218 and light emitting faces 220a, 220c, 220d, 220f. In this embodiment, the first photoluminescence material 216a covers the light emitting faces 220a, 220b, 220c of the first LEDs 212a. In other words, the first photoluminescence material 216a covers the light emitting faces 220b opposite the circular substrate 214 on which the first LEDs 212a are mounted; and the first photoluminescence material 216a covers the light emitting faces 220a, 220c adjacent the circular substrate 214 on which the first LEDs 212a are mounted. This can improve the uniformity of light emission from the first LEDs. In this embodiment, the first photoluminescence material 216a is directly in contact with the first LEDs 212a. This can improve luminous efficacy, since more of the blue excitation light is incident on the first photoluminescence material 216a, leading to improved levels of converted light having a peak emission wavelength ranging from 500 nm to 590 nm.

Similarly, the first and second photoluminescence materials 216a, 216b cover the light emitting faces 220d, 220c, 220f of the second LEDs 212b. The second photoluminescence material 216b is directly in contact with the second LEDs 212b, and the first photoluminescence material 216a overlays the second photoluminescence material 216b. In this embodiment, therefore, the blue excitation light emitted from the second LEDs 212b traverses the second photoluminescence material 216b before reaching the first photoluminescence material 216a. The second photoluminescence material 216b covers the light emitting faces 220e opposite the circular substrate 214 on which the second LEDs 212b are mounted; and the second photoluminescence material 216b covers the light emitting faces 220d, 220f adjacent the circular substrate 214 on which the second LEDs 212b are mounted. This can improve the uniformity of light emission from the second LEDs 212b. This also improves luminous efficacy, since more of the blue excitation light will be incident on the second photoluminescence material 216b, leading to improved levels of converted light having a peak emission wavelength ranging from 600 nm to 650 nm.

The white light emitting device 210 formed in accordance with the invention exhibits improved luminous efficacy and thermal stability compared with known constructions. More particularly, the arrangement in which the first LEDs 212a are covered by the first photoluminescence material 216a, and the second LEDs 212b are covered by the first and second photoluminescence materials 216a, 216b, converts the blue excitation light into red light more effectively. It may be that in some embodiments the majority of the blue excitation light from the second LEDs 212b is converted to light having a peak emission wavelength in a range from 600 nm to 650 nm by the second photoluminescence materials 216b. White light is thus generated from the combination of the unconverted blue excitation light from the first and second LEDs 212a, 212b, the light having a peak emission wavelength in a range from 500 nm to 590 nm generated by the first photoluminescence material 216a, and the light having a peak emission wavelength in a range from 600 nm to 650 nm generated by the second photoluminescence material 216b.

Optionally, the white light emitting device 210 may include a diffusing layer (not shown). The diffusing layer may improve the color uniformity of light emission by the white light emitting device 210. The diffusing layer may be in direct contact with the first photoluminescence material 216a. It may be that the diffusing layer includes a light transmissive material and light scattering particles. Enhanced color uniformity is particularly advantageous when the device is used in large beam optics. Moreover, the amount of photoluminescence material used may also be reduced, thereby providing a more cost-effective manner of manufacturing the white light emitting device 210. This is because the diffusing layer includes light scattering particles, increasing the probability that a photon will result in the generation of photoluminescence light by directing blue excitation light back into the first or second photoluminescence materials 216a, 216b. Thus, the amount of photoluminescence material 216a, 216b required to generate a given color temperature of light can be reduced, since more of the blue excitation light is converted to photoluminescence light owing to the diffusing layer.

Figure 3:
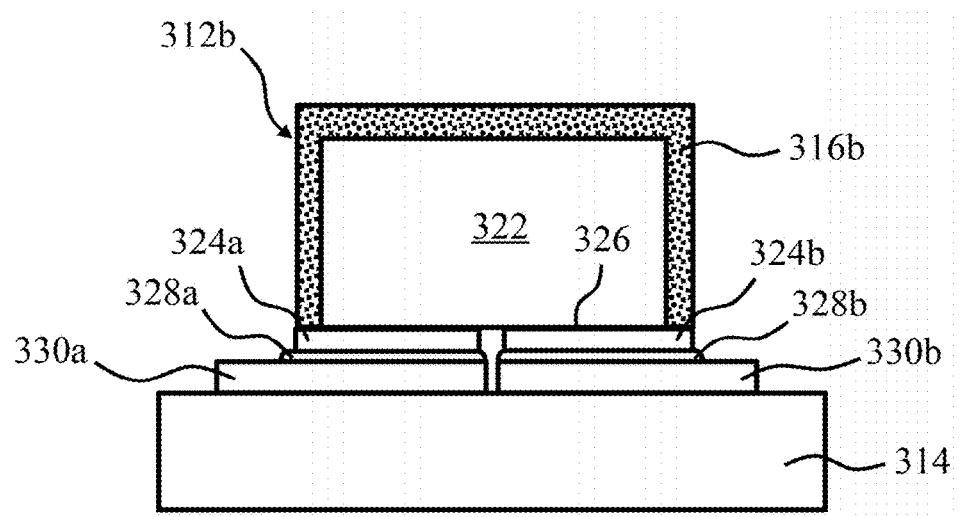
FIG. 3 is a schematic representation of a flip-chip second LED formed in accordance with an embodiment of the invention.

Referring now to FIG. 3, there is shown a schematic representation of a flip-chip second LED 312b formed in accordance with an embodiment of the invention.

The flip-chip second LED 312b includes an InGaN (indium gallium nitride) die 322 coated with a second photoluminescence material 316b. The InGaN (indium gallium nitride) die 322 is operable to generate excitation light having a dominant wavelength in a range from 440 nm to 480 nm. The second photoluminescence material 316b is operable to generate light having a peak emission wavelength in a range from 600 nm to 650 nm. The die 322 includes an n-electrode 324a and a p-electrode 324b at its base 326. The n-electrode 324a and a p-electrode 324b are connected to two corresponding bonding pads 328a, 328b. In turn, bonding pad 328a is seated on a contact pad 330a, while the other bonding pad 328b is seated on a contact pad 330b. The contact pads 330a, 330b are mounted on a planar substrate 314.

Figure 4:
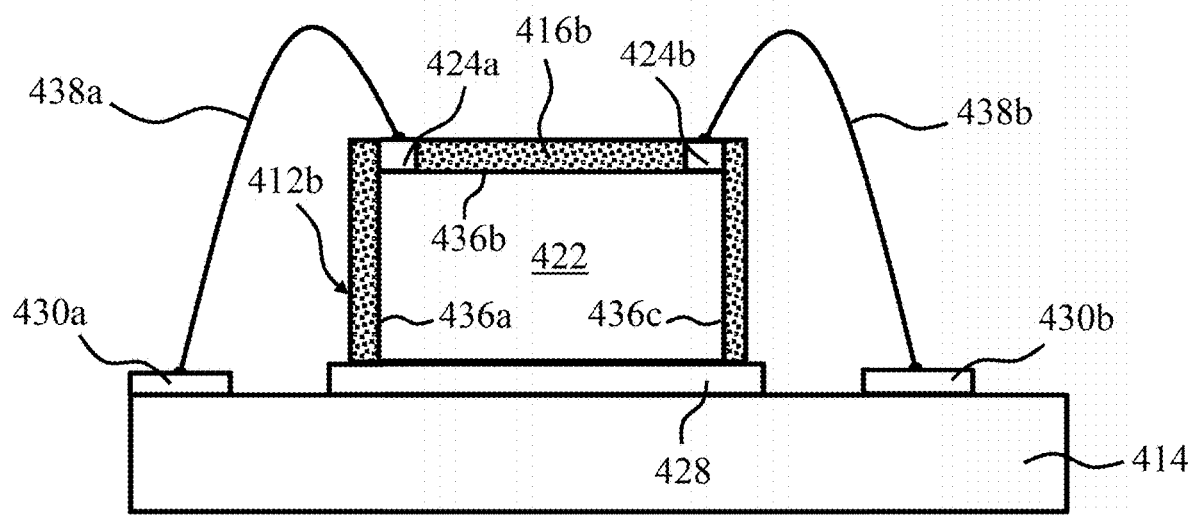
FIG. 4 is a schematic representation of a lateral-chip second LED formed in accordance with an embodiment of the invention.

Referring to FIG. 4, there is shown a schematic representation of a lateral-chip second LED 412b formed in accordance with an embodiment of the invention.

The lateral-chip second LED 412b includes an InGaN (indium gallium nitride) die 422 coated with a second photoluminescence material 416b on its upper 436b and all side surfaces 436a, 436c. The die 422 is seated on bonding pad 428. The die 422 is operable to generate excitation light having a dominant wavelength in a range from 440 nm to 480 nm. The second photoluminescence material 416b is operable to generate light having a peak emission wavelength in a range from 600 nm to 650 nm. The die 422 includes an n-electrode 424a and a p-electrode 424b on opposing ends of its upper surface 436b. Bond wires 438a, 438b connect the n-electrode 424a and the p-electrode 424b to corresponding contact pads 430a, 430b, which are mounted on a planar substrate 414.

Figure 5:
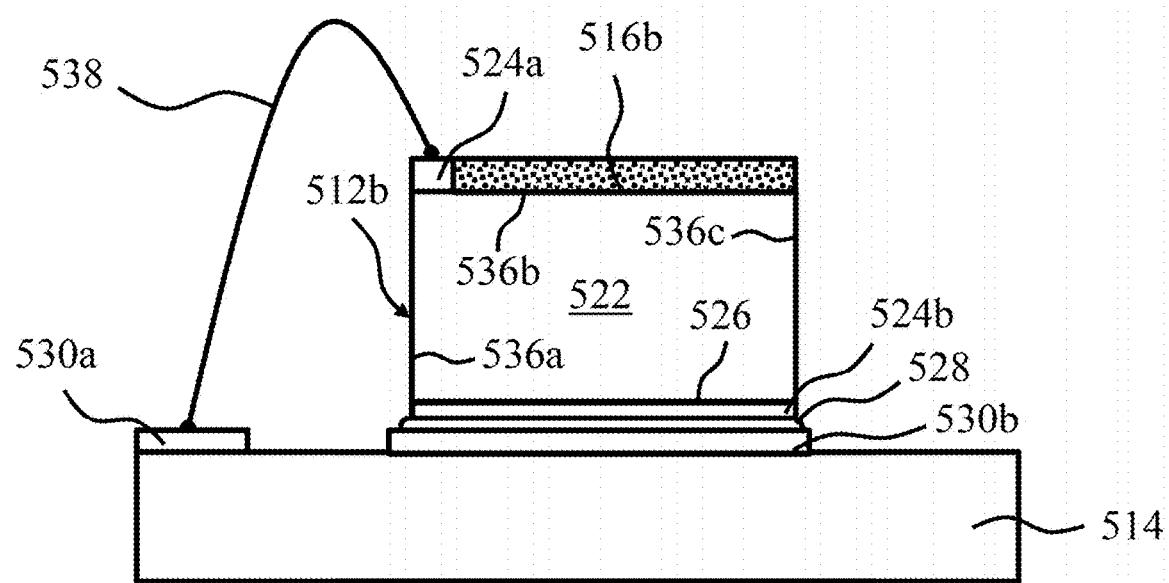
FIG. 5 is a schematic representation of a vertical-chip second LED formed in accordance with an embodiment of the invention.

Referring to FIG. 5, there is shown a schematic representation of a vertical-chip second LED 512b formed in accordance with an embodiment of the invention.

The vertical-chip second LED 512b includes an InGaN (indium gallium nitride) die 522 coated with a second photoluminescence material 516b on its upper surface 536b only. More particularly, the side surfaces 536a, 536c are not coated with the second photoluminescence material 516b, since the vertical chip emits light from its upper surface only. The die 522 is operable to generate excitation light having a dominant wavelength in a range from 440 nm to 480 nm. The second photoluminescence material 516b is operable to generate light having a peak emission wavelength in a range from 600 nm to 650 nm. The die 522 includes an n-electrode 524a on one end of its upper surface 536b. A bond wire 538a connects the n-electrode 524a to a corresponding contact pad 530a which is mounted on a planar substrate 514. The die 522 includes a p-electrode 424b at its base 526 which is seated on bonding pad 528. In turn, bonding pad 328 is seated on a contact pad 530b, which is mounted on a planar substrate 314.

Figure 6:
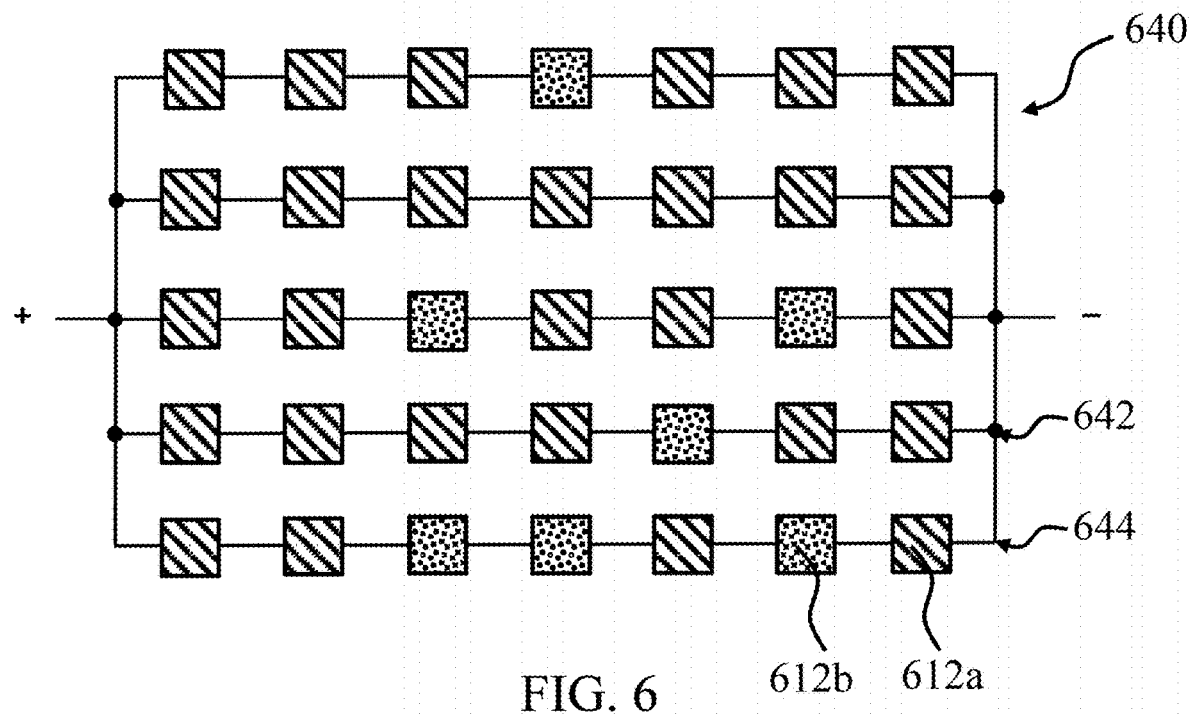
FIG. 6 is a plan view of a circuit configuration of first and second LED arrays in accordance with an embodiment of the invention.

Referring now to FIG. 6, there is shown a circuit configuration 640 of first LED arrays 612a and second LED (coated with a second photoluminescence material) arrays 612b in accordance with an embodiment of the invention. The circuit configuration 640 includes five strings, each having an array of seven serially connected LEDs. There are twenty-eight first LEDs 612a and seven second LEDs 612b distributed among the configuration 640. More particularly, in the first string there is one second LED 612b and six first LEDs 612a, in the second string seven first LEDs 612a, in the third string two second LEDs 612b, in the fourth string six first LEDs 612a and one second LED 612b, and in the fifth string four first LEDs 612a and three second LEDs 612b. In this way, a first string 642 can have first LEDs 612a and second LEDs 612b in a ratio of 0:1 to 1:0, and a second string 644 can have first LEDs 612a and second LEDs 612b in a ratio of 0:1 to 1:0. Advantageously, the same voltage is applied to both strings 642, 644.

Figure 7:
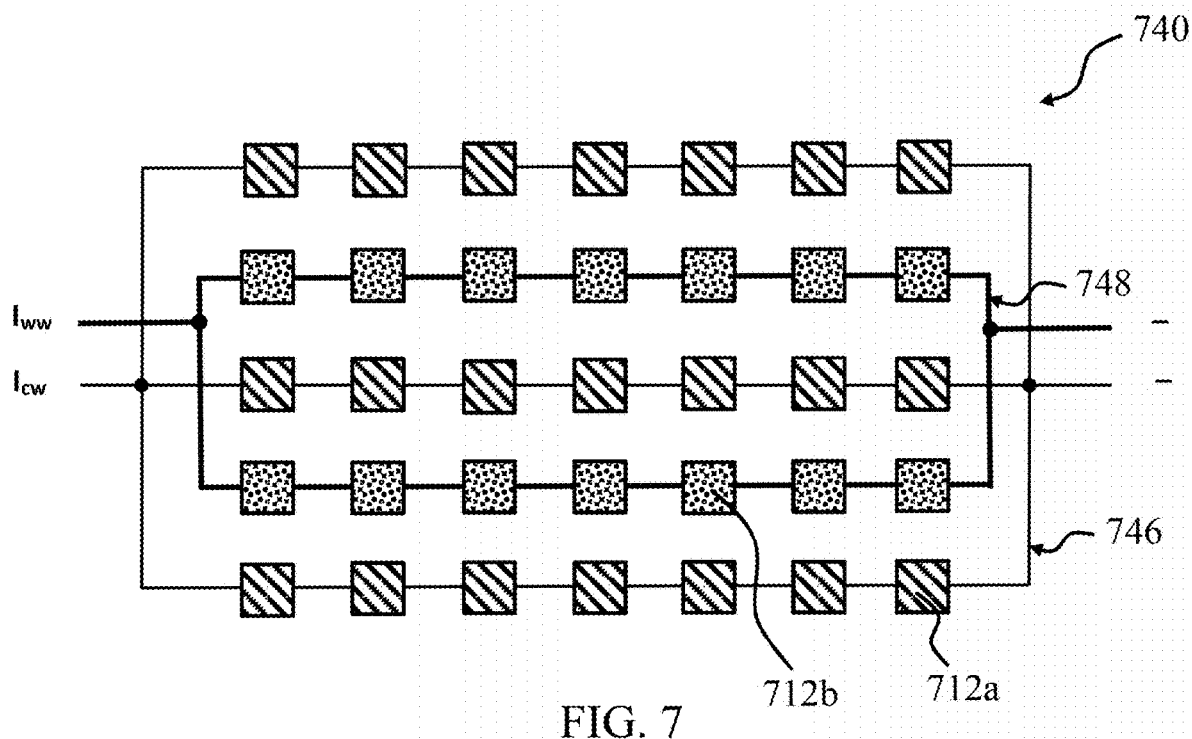
FIG. 7 is a plan view of an alternative circuit configuration of first and second LED arrays in accordance with another embodiment of the invention.

Referring now to FIG. 7, there is shown an alternative circuit configuration 740 of first LED arrays 712a and second LED (coated with a second photoluminescence material) arrays 712b in accordance with another embodiment of the invention. In this embodiment, the alternative circuit configuration 740 includes a first circuit 746 having three parallel connected strings of seven serially connected first LEDs 712a and a second circuit 748 having two parallel connected strings of seven serially connected second LEDs (coated with a second photoluminescence material) 712b. Having separate circuits, that is, a first circuit 746 and a second circuit 748, enables the first LEDs 712a and second LEDs 712b to be independently controlled. Thus, a white light emitting device having such a circuit configuration 740 constitutes a color tunable light emitting device. The first and second LEDs 712a, 712b can be driven by the same drive current, which provides a simplified and robust system, leading to improved efficacy. Advantageously, the same power can be applied to the first and second circuits 746, 748, thereby providing a simplified and robust system.

Experimental

Figure 8:
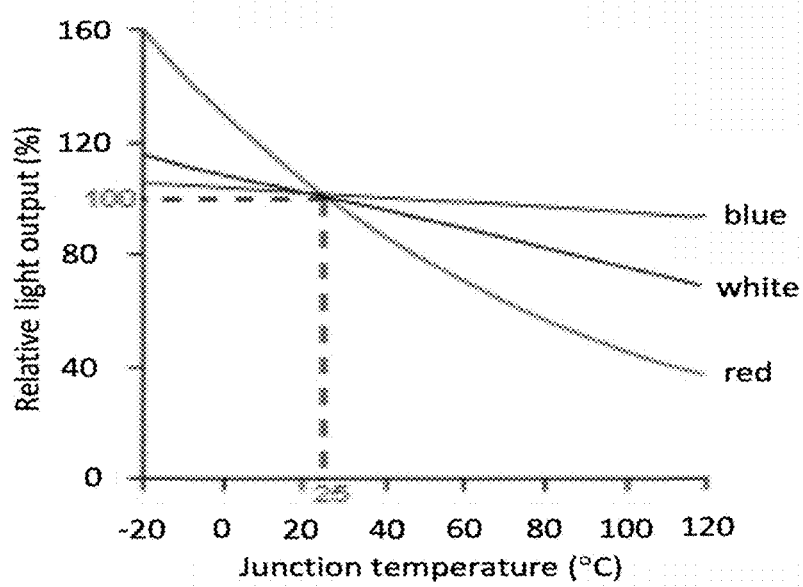
FIG. 8 is a plot showing the thermal stability of red and blue LED chips.

Referring to FIG. 8, there is shown a plot of the thermal stability for red and blue LED chips and a white LED. The plot shows relative light output (%) vs junction temperate (° C.) for red and blue LED chips and a white LED. The plots are normalized at 100% at 25° C. At this point, the red and blue LED chips and white LED have an equal light output. However, it can be seen that as the temperature increases towards 120° C., the relative light output of red LED chips drops to approximately 40% while the relative light output of blue LED chips only drops to approximately 98%. This demonstrates that red LED chips degrade much faster than blue LED chips. It will be appreciated that for white LEDs based on red and blue LED chips, the color temperature of white light generated by such LEDs will increase with increasing junction temperature due to relatively quicker decrease in output with temperature of red LED chips compared with blue LED chips, resulting in a decrease in the ratio of red to blue light with increasing temperature. Hence, in accordance with a benefit of the present invention, it will be understood that photoluminescence material coated red LED chips (i.e., blue LED chips coated with red phosphor material) have a better thermal color stability than traditional red LED chips.

Experiments 1 and 2 were conducted together with a Control Experiment. The composition of the phosphor layers used in these experiments is shown in Tables 1 and 2.

In Experiment 1, there was provided a white light emitting device which included twenty-four blue LEDs disposed on a circular substrate (COB). A red phosphor layer having the composition of Table 1 was dispensed over twelve of the twenty-four blue LEDs, thereby coating their light emitting faces entirely with the red phosphor layer. A yellow and green phosphor (mixture) layer having the composition of Table 2 below was then dispensed over the circular substrate, thereby covering the twelve red-phosphor-coated LEDs and the twelve non-coated LEDs.

In Experiment 2, there was provided a white light emitting device which included twenty-four blue LEDs disposed on a circular substrate (COB). A red phosphor layer having the composition of Table 1 below was dispensed over all twenty-four blue LEDs thereby coating their light emitting faces entirely with the red phosphor layer. A yellow and green phosphor (mixture) layer having the composition of Table 2 below was then dispensed over the circular substrate thereby covering all the twenty-four red-phosphor-coated LEDs.

In the Control Experiment, there was provided a white light emitting device which included twenty-four blue LEDs disposed on a circular substrate (COB). A yellow and green phosphor (mixture) layer having the composition of Table 2 below was dispensed over the circular substrate thereby covering all the twenty-four blue LEDs. The blue LEDs were not coated with a red phosphor layer.

TABLE 1 red phosphor layer

| | Phosphor/ concentration red phosphor | Silicone/ concentration Silicone A | Silicone/ concentration Silicone B |
|---|---|---|---|
| Experiment 1 | 5% | 84% | 16% |
| Experiment 2 | 3.5% | 84% | 16% |

TABLE 2 green and yellow phosphor layer

| | green phosphor | yellow phosphor | Silicone | concentration | Weight |
|---|---|---|---|---|---|
| Control | 13.84 | 0.78 | Silicone B | 29.02% | 46.0 mg |
| Experiment 1 | 0.6 | 0.4 | Silicone B | 15.85% | 37.5 mg |
| Experiment 2 | 0.6 | 0.4 | Silicone B | 18.04% | 37.0 mg |

The results of Experiments 1 and 2 and the Control Experiment are shown in Table 3 below. All values in Table 3 are average values.

TABLE 3

Experimental Results

| | Flux (lm) | CIE x | CIE y | CCT (K) | $V_f$ (V) | CRI Ra | CRI R9 | Efficacy (lm/W) |
|---|---|---|---|---|---|---|---|---|
| Control | 925.4 | 0.4349 | 0.4034 | 3029 | 17.17 | 83.4 | 10.7 | 154.0 |
| Experi- | 931.5 | 0.4335 | 0.4015 | 3037 | 17.17 | 82.3 | 11.0 | 155.0 |

TABLE 3-continued

Experimental Results

| | Flux (lm) | CIE x | CIE y | CCT (K) | $V_f$ (V) | CRI Ra | CRI R9 | Efficacy (lm/W) |
|---|---|---|---|---|---|---|---|---|
| Experiment 1 | | | | | | | | |
| Experiment 2 | 937.1 | 0.4325 | 0.4028 | 3066 | 17.17 | 80.9 | 7.4 | 155.9 |

The current used in all Experiments was 349.9 mA. The efficacy of Experiments 1 and 2 is based on the normalized forward voltage ($V_f$) value of 17.17 of the Control Experiment. A true comparison of the Control Experiment, Experiment 1 and Experiment 2 is thus achieved.

A comparison of the Efficacy between the Control Experiment (154.01 lm/W) and Experiment 1 (155.02 lm/W) shows an improvement of 1.01 lm/W equating to approximately 0.66%. This demonstrates that by covering half of the blue LEDs with the red phosphor layer and then all the blue LEDs with a yellow/green phosphor mixture layer, a superior efficacy is achieved that is approximately 0.66% better than known constructions (Control Experiment), which is a significant improvement and advantage.

A comparison of the Efficacy between the Control Experiment (154.01 lm/W) and Experiment 2 (155.94 lm/W) shows an improvement of 1.93 lm/W equating to approximately 1.25%. This demonstrates that by covering all of the blue LEDs with the red phosphor layer and then all the blue LEDs with a yellow/green phosphor mixture layer, a superior efficacy is achieved that is approximately 1.25% better than known constructions (Control Experiment), which is a significant improvement and advantage.

As used in this document, both in the description and in the claims, and as customarily used in the art, the words "substantially," "approximately," and similar terms of approximation are used to account for manufacturing tolerances, manufacturing variations, and manufacturing imprecisions that are inescapable parts of fabricating any mechanism or structure in the physical world.

While the invention has been described in detail, it will be apparent to one skilled in the art that various changes and modifications can be made and equivalents employed, without departing from the present invention. It is to be understood that the invention is not limited to the details of construction, the arrangements of components, and/or the method set forth in the above description or illustrated in the drawings. Statements in the summary of this document, and the figures, are merely exemplary; they are not, and cannot be interpreted as, limiting the scope of the claims. Topical headings and subheadings are for the convenience of the reader only and should not and cannot be construed to have any substantive significance, meaning or interpretation, and should not and cannot be deemed to indicate that all of the information relating to any particular topic is to be found under or limited to any particular heading or subheading. The Abstract is not intended to define the invention, nor is it intended to limit to the scope of the invention. The purpose of the clauses of this document is to provide support for claims in any later-filed foreign patent applications claiming priority to this document; they are not intended to define the invention, nor are they intended to limit to the scope of the invention. Therefore, the invention is not to be restricted or limited except in accordance with the claims and their legal equivalents.

Clauses

It will be understood that the following clauses form part of the disclosure of the invention defined herein. More particularly, the invention herein may be defined by the combination of the features of the clauses as detailed below, and the clauses may be utilized to amend the combination of the features within the claims of this application.

1. A white light emitting device comprising:
    first and second LEDs operable to generate excitation light having a dominant wavelength in a range from 440 nm to 480 nm and mounted on a substrate;
    a first photoluminescence material which generates light having a peak emission wavelength in a range from 500 nm to 590 nm; and
    a second photoluminescence material which generates light having a peak emission wavelength in a range from 600 nm to 650 nm,
    wherein the first LED is covered by the first photoluminescence material, and the second LED is covered by the first and second photoluminescence materials.
2. The white light emitting device of Clause 1, wherein the first photoluminescence material covers the light emitting faces of the first LED.
3. The white light emitting device of Clause 1 or Clause 2, wherein the first and second photoluminescence materials cover the light emitting faces of the second LED.
4. The white light emitting device of any of Clauses 1 to 3, wherein the first photoluminescence material is directly in contact with the first LED.
5. The white light emitting device of any of Clauses 1 to 3, wherein the first photoluminescence material is located remotely to the first and second LEDs.
6. The white light emitting device of Clause 5, wherein the first photoluminescence material is in the form of a component.
7. The white light emitting device of any of Clauses 1 to 6, wherein the second photoluminescence material is directly in contact with the second LED.
8. The white light emitting device of any of Clauses 1 to 7, wherein the first photoluminescence material generates light having a peak emission wavelength in a range from 520 nm to 530 nm.
9. The white light emitting device of any of Clauses 1 to 8, wherein the second photoluminescence material generates light having a peak emission wavelength in a range from 620 nm to 635 nm.
10. The white light emitting device of any of Clauses 1 to 9, wherein the first photoluminescence material comprises a first phosphor material and/or the second photoluminescence material comprises a second phosphor material.
11. The white light emitting device of Clauses 10, wherein the first phosphor material is excitable to generate white light having a correlated color temperature of 5000K to 6500K.
12. The white light emitting device of Clause 10 or Clause 11, wherein the second phosphor material is excitable to generate white light having a correlated color temperature of 2700K to 3500K.
13. The white light emitting device of Clause 10, wherein the first phosphor material comprises at least one selected from $Y_{3-x}(Al_{1-y}Ga_y)_5O_{12}:Ce_x$; $(Y,Ba)_{3-x}(Al_{1-y}Ga_y)_5O_{12}:Ce_x$; $Lu_{3-x}(Al_{1-y}M_y)_5O_{12}:Ce_x$ where M=Mg, Ca, Sr, Ba, Ga; $A_2SiO_4:Eu$ where A=Mg, Ca, Sr, Ba; $(Sr_{1-x}Ba_x)_2SiO_4:Eu$; and $M_xSi_{12-(m+n)}Al_{m+n}O_nN_{16-n}:Eu$ where M=Mg, Ca and/or Sr.

14. The white light emitting device of Clause 10, wherein the second phosphor material comprises at least one selected from $(Ca_{1-x}Sr_x)AlSiN_3$:Eu; $Ba_{2-x}Sr_xSi_5N_8$:Eu; $MSe_{1-x}S_x$:Eu where M=Mg, Ca, Sr, Ba, Zn; $CaSe_{1-x}S_x$: Eu, $(Sr_{1-x}M_x)_yEu_zSiO_5$ where M=Ba, Mg, Ca, Zn; $K_2SiF_6$:$Mn^{4+}$; and $K_2TiF_6$:$Mn^{4+}$.

15. The white light emitting device of any of Clauses 1 to 9, wherein the first photoluminescence material comprises a first quantum dot material and/or the second photoluminescence material comprises a second quantum dot material.

16. The white light emitting device of any of Clauses 1 to 15, comprising a plurality of first and second LEDs.

17. The white light emitting device of Clause 16, wherein the plurality of first and second LEDs are in the form of symmetrical arrays.

18. The white light emitting device of Clause 16, wherein the plurality of first and second LEDs are in the form of asymmetrical arrays.

19. The white light emitting device of Clause 16, wherein the first and second LEDs comprise the same drive current.

20. The white light emitting device of claim 16, comprising a first string having first and second LEDs in a ratio of 0:1 to 1:0, and a second string having first and second LEDs in a ratio of 0:1 to 1:0.

21. The white light emitting device of Clause 20, wherein the same power is applied to the first and second strings.

22. The white light emitting device of Clause 20, wherein the power applied to the first and second strings is independently controllable.

23. The white light emitting device of any of Clauses 1 to 22, wherein the first and/or second LEDs are in the form of a flip chip, vertical chip or lateral chip.

24 The white light emitting device of any of Clauses 1 to 23, comprising a diffusing layer.

25. The white light emitting device of Clause 24, wherein the diffusing layer is in direct contact with the first photoluminescence material.

26. The white light emitting device of Clause 24 or Clause 25, wherein the diffusing layer comprises a light transmissive material and light scattering particles.

27. The white light emitting device of any of Clauses 1 to 26, wherein the substrate comprises a circuit board, optionally a ceramic substrate or metal core printed circuit board.

28. The white light emitting device of any of Clauses 1 to 27, being a tunable white light emitting device.

29. A method of manufacturing a white light emitting device, comprising the steps of:
providing first and second LEDs operable to generate excitation light having a dominant wavelength in a range from 440 nm to 480 nm;
providing a first photoluminescence material which generates light having a peak emission wavelength in a range from 500 nm to 590 nm;
providing a second photoluminescence material which generates light having a peak emission wavelength in a range from 600 nm to 650 nm;
disposing the second photoluminescence material over the second LED; and
disposing the first photoluminescence material over the first and second LEDs.

30. The method of Clause 29, comprising a plurality of first and second LEDs.

31. The method of Clause 29 or Clause 30, comprising the step of disposing a diffusing layer over the first photoluminescence material.

32. A white light emitting device comprising:
a first LED operable to generate excitation light having a dominant wavelength in a range from 440 nm to 480 nm;
a first photoluminescence material which generates light having a peak emission wavelength in a range from 500 nm to 590 nm; and
a photoluminescence converted LED operable to generate light having a peak emission wavelength in a range from 600 nm to 650 nm, the photoluminescence converted LED comprising a second LED operable to generate excitation light and a second photoluminescence material that covers the light emitting faces of the second LED; and
wherein the first photoluminescence material covers the first LED and the photoluminescence converted LED.

33. A white light emitting device comprising:
a first LED operable to generate excitation light having a dominant wavelength in a range from 440 nm to 480 nm;
a first photoluminescence material which generates light having a peak emission wavelength in a range from 500 nm to 590 nm; and
a photoluminescence converted LED operable to generate light having a peak emission wavelength in a range from 600 nm to 650 nm, the photoluminescence converted LED comprising a second LED operable to generate excitation light having a dominant wavelength in a range from 440 nm to 480 nm and a second photoluminescence material which generates light having a peak emission wavelength in a range from 600 nm to 650 nm and covers the light emitting faces of the LED; and
wherein the first photoluminescence material covers the first LED and the photoluminescence converted LED.

What is claimed is:

1. A light emitting device, comprising:
a plurality of first LEDs;
a plurality of second LEDs;
a first photoluminescence material for generating light having a peak emission wavelength in a range from 500 nm to 590 nm; and
a second photoluminescence material for generating light having a peak emission wavelength in a range from 600 nm to 650 nm;
wherein the first LEDs and the second LEDs are for generating light having a dominant wavelength in a range from 440 nm to 480 nm; and
wherein the first LED is covered by the first photoluminescence material, and the second LED is covered by the second photoluminescence material and the first photoluminescence material.

2. The light emitting device of claim 1, wherein a majority, or all, of the light from the second LEDs is converted by the second photoluminescence material to light having a peak emission wavelength in the range from 600 nm to 650 nm.

3. The light emitting device of claim 1, wherein the first LEDs and the first photoluminescence material are for generating light having a color temperature of 5000K to 6500K; and wherein the second LEDs and the first and second photoluminescence material are for generating light having a color temperature of 2700K to 3500K.

4. The light emitting device of claim 1, wherein the first and second LEDs are configured such that power can be independently applied to the first and second LEDs.

5. The light emitting device of claim 4, wherein the first LEDs are connected in series as at least one string, and the second LEDs are connected in series as at least one string.

6. The light emitting device of claim 1, comprising a first string having first and second LEDs in a ratio of 0:1 to 1:0, and a second string having first and second LEDs in a ratio of 0:1 to 1:0.

7. The light emitting device of claim 6, wherein the first and second strings are connected in parallel.

8. The light emitting device of claim 1, comprising a circuit configuration of first LED arrays and second LED arrays;
wherein the circuit configuration comprises a plurality of strings, and each string having an array of serially connected LEDs.

9. The light emitting device of claim 8, wherein the circuit configuration comprises a first circuit having a plurality of parallel connected strings of serially connected first LEDs, and a second circuit comprising a plurality of parallel connected strings of serially connected second LEDs.

10. The light emitting device of claim 1, wherein the first photoluminescence material comprises at least one phosphor selected from $Y_{3-x}(Al_{1-y}Ga_y)_5O_{12}:Ce_x$; $(Y,Ba)_{3-x}(Al_{1-y}Ga_y)_5O_{12}:Ce_x$; $Lu_{3-x}(Al_{1-y}M_y)_5O_{12}:Ce_x$ where M=Mg, Ca, Sr, Ba, Ga; $A_2SiO_4$:Eu where A=Mg, Ca, Sr, Ba, $(Sr_{1-x}Ba_x)_2SiO_4$:Eu; and $M_xSi_{12-(m+n)}Al_{m+n}O_nN_{16-n}$:Eu where M=Mg, Ca and/or Sr.

11. The light emitting device of claim 1, wherein the second photoluminescence material comprises at least one phosphor selected from $(Ca_{1-x}Sr_x)AlSiN_3$:Eu; $Ba_{2-x}Sr_xSi_5N_8$:Eu; $MSe_{1-x}S_x$:Eu where M=Mg, Ca, Sr, Ba, Zn; $CaSe_{1-x}S_x$:Eu, $(Sr_{1-x}M_x)_yEu_zSiO_5$ where M=Ba, Mg, Ca, Zn; $K_2SiF_6:Mn^{4+}$; and $K_2TiF_6:Mn^{4+}$.

12. The light emitting device of claim 1, comprising a diffusing layer covering the first photoluminescence material.

13. The light emitting device of claim 12, wherein the diffusing layer is in direct contact with the first photoluminescence material.

14. The light emitting device of claim 1, wherein the light emitting device is color tunable.

* * * * *